United States Patent
Han et al.

(10) Patent No.: US 7,755,398 B2
(45) Date of Patent: Jul. 13, 2010

(54) TIME CONSTANT CALIBRATION DEVICE AND RELATED METHOD THEREOF

(75) Inventors: Song-Rong Han, Taipei Hsien (TW); Ming-Shih Yu, Taipei Hsien (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 49 days.

(21) Appl. No.: 11/871,161

(22) Filed: Oct. 12, 2007

(65) Prior Publication Data

US 2009/0096488 A1    Apr. 16, 2009

(51) Int. Cl.
*H03K 5/153* (2006.01)

(52) U.S. Cl. .............................. 327/77; 327/88; 327/91; 702/85

(58) Field of Classification Search ................... 327/72, 327/73, 77, 83, 88, 89, 337, 91, 92, 94, 95, 327/96, 97; 702/85, 89, 99, 106, 107
See application file for complete search history.

(56) References Cited

U.S. PATENT DOCUMENTS 6,262,603 B1*  7/2001  Mohan et al. .................. 327/77
6,968,167 B1*  11/2005  Wu et al. .................. 455/251.1
2004/0130377 A1*  7/2004  Takeda et al. ................ 327/337
2004/0239296 A1*  12/2004  Turchi ......................... 323/222
2005/0264300 A1*  12/2005  Chang et al. ................ 324/601

* cited by examiner

*Primary Examiner*—Lincoln Donovan
*Assistant Examiner*—Shikha Goyal
(74) *Attorney, Agent, or Firm*—Winston Hsu (57) ABSTRACT

A time constant calibration device includes: a first voltage generating circuit utilizing a first current passing through a capacitive component to generate a first voltage; a second voltage generating circuit utilizing a second current passing through a resistive component to generate a second voltage; and a comparing circuit for comparing the first voltage with the second voltage to generate a comparing signal, wherein the first voltage generating circuit comprises an analog adjusting component for adjusting the first voltage according to the comparing signal until the first voltage is equal to the second voltage, whereby an RC time constant defined by an equivalent capacitance corresponding to the first current passing through the capacitive component and an equivalent impedance corresponding to the second current passing through the resistive component reaches a predetermined value.

6 Claims, 5 Drawing Sheets

TIME CONSTANT CALIBRATION DEVICE AND RELATED METHOD THEREOF

BACKGROUND OF THE INVENTION

1. Field of the Invention

The present invention relates to a time constant calibration circuit, and more particularly, to a time constant calibration circuit and related method utilizing an analog adjusting mechanism for adjusting a capacitor or a current source.

2. Description of the Prior Art

Filters are generally needed in many communication transmission application circuits. Because the variability of an R.C. filter is smaller than that of a gmC filter, the R.C. filter is widely used as it is more easily controlled when designed. However, RC components have errors due to process variations, causing the actual time constant value to differ from a preset (desired) value, which further affects performance of the circuit and accuracy of the frequency response. For those cases without calibration included, the difference between the actual value and preset value is up to ±30%-50% (depending on the types of capacitors and resistors used); and such a great frequency response offset in the circuit is unacceptable for circuits demanding accurate frequency response.

Figure 1:
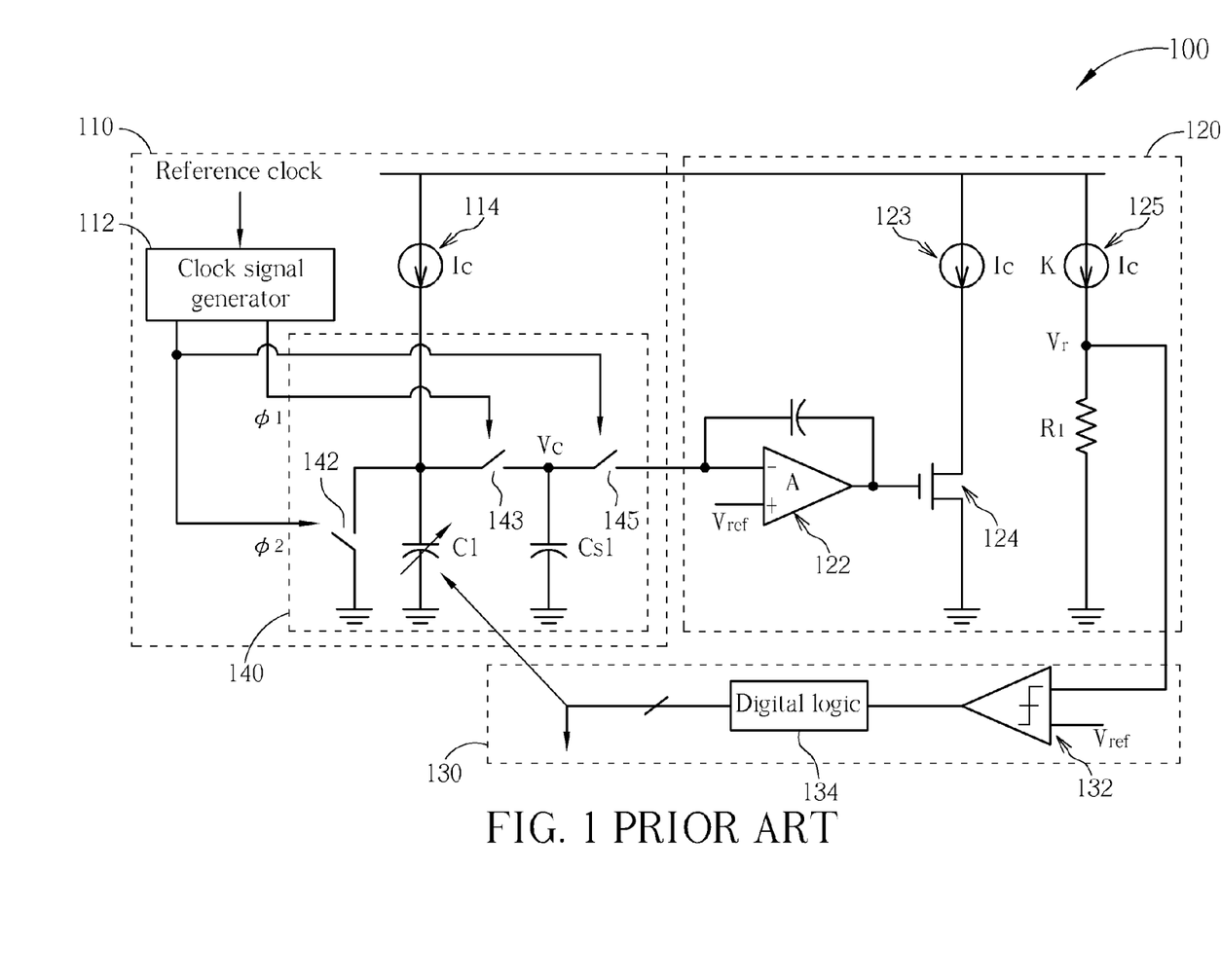
FIG. 1 is a circuit diagram illustrating a conventional time constant calibration device.

To handle the time constant errors caused by process variations, many circuits and methods suitable for automatic frequency calibration are developed. Please refer to FIG. 1. FIG. 1 is a circuit diagram illustrating a conventional time constant calibration device 100. As shown in FIG. 1, the time constant calibration device 100 comprises a first voltage generating circuit 110, a second voltage generating circuit 120, and a comparing circuit 130. The first voltage generating circuit 110 comprises a clock signal generator 112, a constant current source 114 for providing a constant current $I_c$, and a switching-capacitor circuit 140. The switching-capacitor circuit 140 comprises a first capacitive component $C_1$, which is a variable capacitive component (e.g., a varactor), a first switch component 142, a second switch component 143, a second capacitive component $C_{s1}$, and a third switch component 145. The clock signal generator 112 respectively generates a first clock signal $\psi_1$ and a second clock signal $\psi_2$, where the first clock signal $\psi_1$ and the second clock signal $\psi_2$ are non-overlapped to each other and are utilized for driving the switching-capacitor circuit 140 to generate a first voltage $V_c$. The second voltage generating circuit 120 comprises a differential circuit 122, a constant current source 123 for providing a constant current $I_c$, a transistor 124 and another constant current source 125 for providing a constant current $K*I_c$ passing through a resistive component to generate a second voltage $V_r$. The comparing circuit 130 comprises a comparator 132 and a digital logic 134, where the comparator 132 compares the second voltage $V_r$ with a bandgap reference voltage $V_{ref}$ to generate a comparing signal. The comparing circuit 130 then sends the comparing signal to the digital logic 134 for generating a digital control code to turn on/off each capacitor unit, thereby further adjusting the final capacitance value of the capacitor $C_1$. It should be noted that related art needs a bandgap reference voltage circuit for generating the needed bandgap reference voltage $V_{ref}$. However, as the bandgap reference voltage circuit has be widely used for different application fields for providing a stable reference voltage within a temperature range, and operations and functions of the bandgap reference voltage circuit are well known to those skilled in the art, further description is omitted here for brevity.

Please note that an objective of the conventional time constant calibration device 100 is to maintain a fixed time constant $R_1*C_1$ by adjusting the variable capacitor $C_1$. Simply described, an operational principle of the conventional time constant calibration device 100 can be represented using two formulas. First, from the view of the second voltage generating circuit 120, the second voltage $V_r$ is $V_r - K*I_c*R_1$, and compared with the bandgap reference voltage $V_{ref}$ the second voltage $V_r$ in steady state is $V_{ref} = K*I_c*R_1$. Second, from the view of the first voltage generating circuit 110, the clock signal generator 112 generates the first clock signal $\psi_1$ and the second clock signal $\psi_2$ respectively, where the first clock signal $\psi_1$ and the second clock signal $\psi_2$ with a period T are non-overlapped to each other and are used for driving the switching-capacitor circuit 140, and thus generates a first voltage Vc.

Therefore, when the constant current Ic charges the capacitor $C_1$ in one period T, the first voltage $V_c$ generated by the capacitance $C_1$ is represented by: $V_c = I_c*T/(2C_1)$. When the clock signal allows the capacitor $C_1$ to discharge, the second capacitive component $C_{s1}$ maintains the first voltage $V_c$, and when $V_c = V_{ref}$ an equation $R1*C_1 = T/2K$ is obtained. Because both T and K are known constants, the RC time constant therefore is an invariant value. The control method of the circuit is utilizing the comparator 132 for generating a digital control code to turn on/off each capacitor unit, thereby adjusting the final capacitance value of the capacitor $C_1$. However, a circuit utilizing the digital control code to adjust the final capacitance value needs to design quite a large number of branches of capacitor units with corresponding switches if high resolution is demanded. As a result, applying a capacitance multiplication technique to such a circuit is improper.

However, system on chip (SoC) has become mainstream for IC designs and phase lock loop (PLL) or PLL-based applications are indispensable for SoC. As known to those skilled in this art, as the manufacturing process of CMOS (Complementary Metal-Oxide-Semiconductor) improves, the chip areas of transistors are reduced, except for passive components inside the chip. A low pass filter, consisting of resistor(s) and capacitor(s), is part of the PLL. The low pass filters are always disposed outside the chip for reducing chip area and saving production costs in the past few years. To meet the trend of SoC design nowadays, low pass filters are merged into chips while these passive components still occupy most of the chip area. Therefore how to reduce the area of theses passive components has become an important topic of IC design.

SUMMARY OF THE INVENTION

One objective of the present invention is to provide a time constant calibration device and a method thereof for solving the aforementioned problems.

According to the exemplary embodiment of the present invention, a time constant calibration device is disclosed. The time constant calibration device comprises: a first voltage generating circuit utilizing a first current passing through a first capacitive component to generate a first voltage; a second voltage generating circuit utilizing a second current passing through a resistive component to generate a second voltage; and a comparing circuit for comparing the first voltage with second voltage to generate a comparing signal, wherein the first voltage generating circuit comprises an analog adjusting component for adjusting the first voltage according to the comparing signal until the first voltage is equal to the second voltage, whereby a time constant defined by an equivalent capacitance corresponding to the first current passing through the capacitive component and an equivalent impedance corresponding to the second current passing through the resistive component reaches a predetermined value.

According to another exemplary embodiment of the present invention, a time constant calibration method is disclosed. The time constant calibration method comprises: providing a first current and a capacitive component; utilizing the first current passing through the first capacitive component to generate a first voltage; providing a second current and a resistive component; utilizing the second current passing through the resistive component to generate a second voltage; comparing the first voltage with second voltage to generate a comparing signal; and adjusting the first voltage by an analog adjusting manner according to the comparing signal until the first voltage is equal to the second voltage, whereby a time constant defined by an equivalent capacitance corresponding to the first current passing through the capacitive component and an equivalent impedance corresponding to the second current passing through the resistive component reaches a predetermined value.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to". Also, the term "couple" is intended to mean either an indirect or direct electrical connection. Accordingly, if one device is coupled to another device, that connection may be through a direct electrical connection, or through an indirect electrical connection via other devices and connections.

Figure 2:
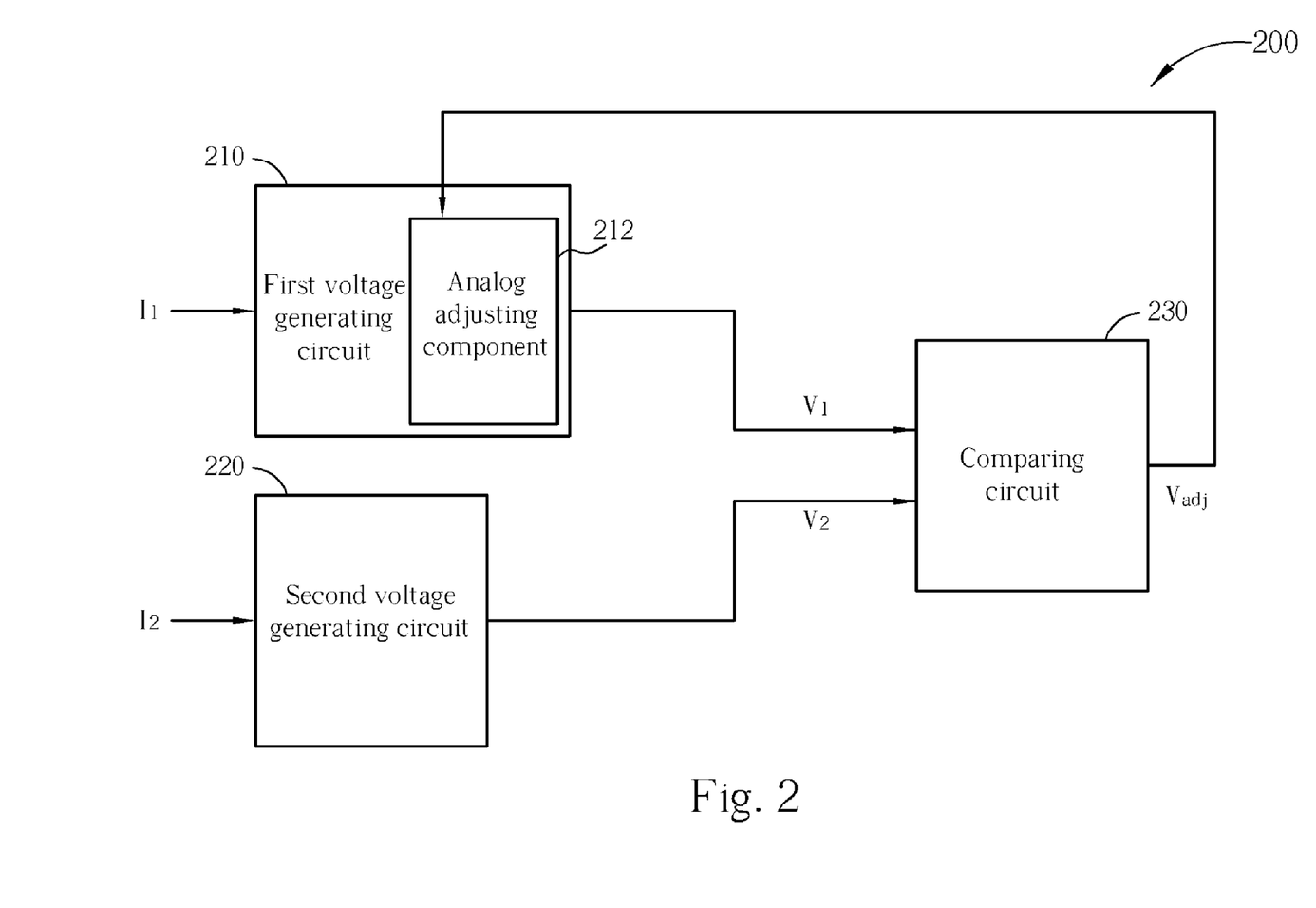
FIG. 2 is a simplified block diagram illustrating a time constant calibration device according to an embodiment of the present invention.

Please refer to FIG. 2. FIG. 2 is a simplified block diagram illustrating a time constant calibration device 200 according to an embodiment of the present invention. As shown in FIG. 2, the time constant calibration device 200 comprises a first voltage generating circuit 210, a second voltage generating circuit 220, and a comparing circuit 230. The first voltage generating circuit 210 utilizes a first current $I_1$ passing through a capacitive component to thereby generate a first voltage $V_1$; the second voltage generating circuit 220 utilizes a second current $I_2$ (e.g., $I_2=K*I_1$) passing through a resistive component to thereby generate a second voltage $V_2$; and the comparing circuit 230 is electrically connected to the first voltage generating circuit 210 and the second voltage generating circuit 220, and is for comparing the first voltage $V_1$ with the second voltage $V_2$ to generate a comparing signal $V_{adj}$. The first voltage generating circuit 210 comprises an analog adjusting component 212 implemented therein for adjusting the first voltage $V_1$ according to the comparing signal $V_{adj}$ until the first voltage $V_1$ is equal to the second voltage $V_2$, whereby a time constant defined by an equivalent capacitance (e.g., $C_1$) corresponding to the first current $I_1$ passing through the capacitive component and by an equivalent impedance (e.g., $R_1$) corresponding to the second current I2 passing through the resistive component reaches a predetermined value (e.g., $R_1 X C_1 = T/2K$).

Figure 3:
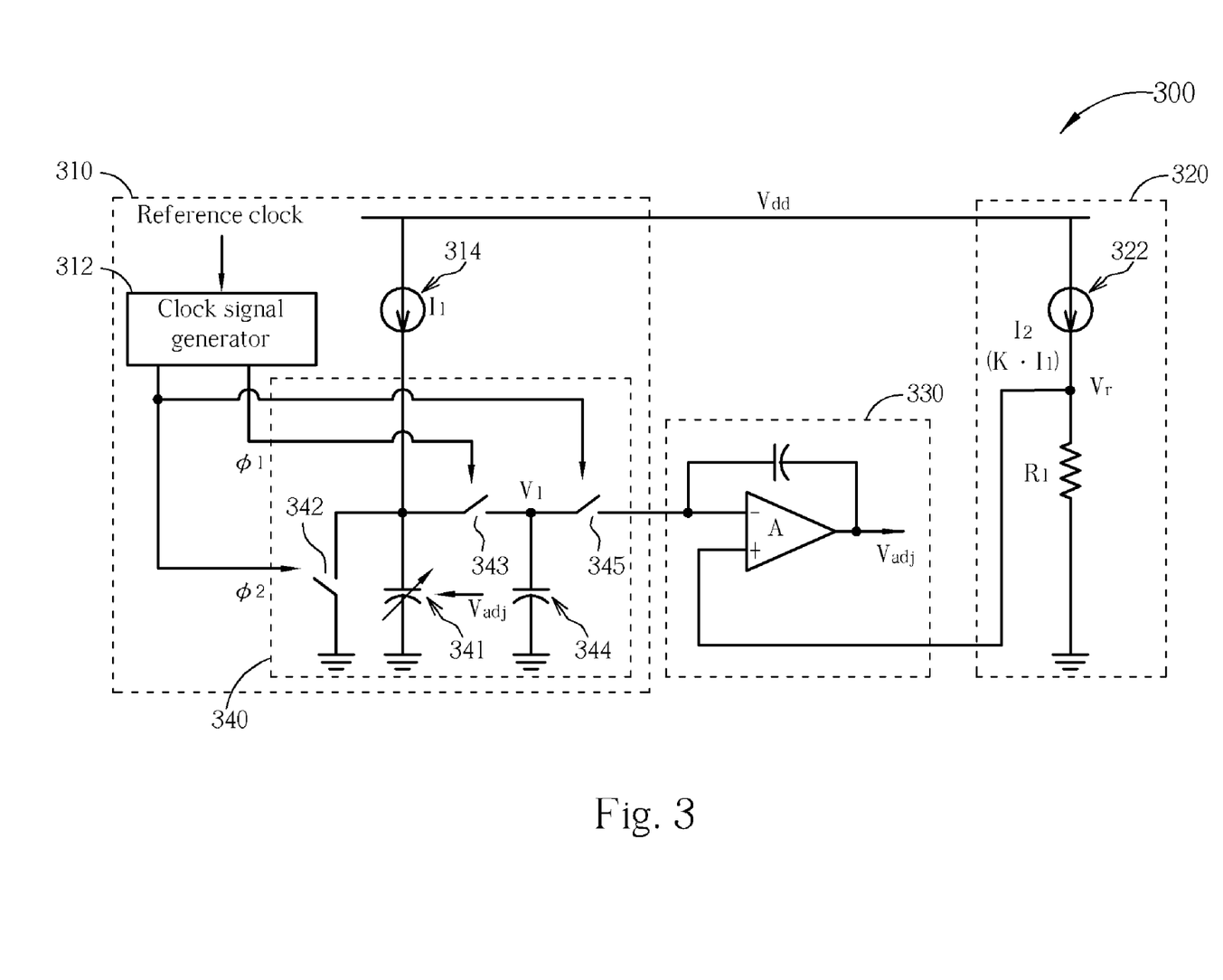
FIG. 3 is a circuit diagram illustrating a time constant calibration device according to a first embodiment of the present invention.

Please refer to FIG. 3. FIG. 3 is a circuit diagram illustrating a time constant calibration device 300 according to a first embodiment of the present invention. As shown in FIG. 3, the time constant calibration device 300 comprises a first voltage generating circuit 310, a second voltage generating circuit 320, and a comparing circuit 330. The second voltage generating circuit 320 utilizes a constant current source 322 for providing a second current $I_2$ (in the present embodiment, $I_2=K*I_1$) passing through a resistive component $R_1$ (e.g., a resistor) to generate a second voltage $V_r$. Additionally, the first voltage generating circuit 310 comprises a clock signal generator 312, a constant current source 314, and a switching-capacitor circuit 340. The clock signal generator 312 is utilized to generate a first clock signal $\psi_1$ and a second clock signal $\psi_2$, where the first clock signal $\psi_1$ and the second clock signal $\psi_2$ with a period T are non-overlapped to each other, and one end of the constant current source 314 is coupled to a first voltage level $V_{dd}$. The switching-capacitor circuit 340 comprises a first capacitive component 341, a first switch component 342, a second switch component 343, a second capacitive component 344, and a third switch component 345, wherein a first end of the first capacitive component 341 is coupled to the constant current source 314 and a second end of the first capacitive component 341 is coupled to a second voltage level (i.e., a ground terminal), and the first capacitive component 341 is charged to generate a first voltage $V_1$ according to the first current $I_1$ provided by the constant current source 314. In this exemplary embodiment, the first capacitive component 341 is an analog variable capacitor, which is a variable capacitor controlled by an analog manner and also serves as the above-mentioned analog adjusting component. As shown in FIG. 3, the first capacitive component 341 (i.e., the analog variable capacitor) is coupled to the comparing circuit 330 for the purpose of adjusting the capacitance value according to a comparing signal $V_{adj}$. The first switch component 342 has a first end coupled to the second voltage level and a second end coupled to the first end of the first capacitive component 341, and is used for selectively making the second end of the first switch component 342 coupled to the first end of the first capacitive component 341 to discharge the first capacitive component 341. The second switch component 343 has a first end coupled to the first end of the first capacitive component 341 and is used for selectively making the first end of the second switch component 343 coupled to the first end of the first capacitive component 341. The second capacitive component 344 has a first end coupled to a second end of the second switch component 343 and a second end coupled to the second voltage level. The third switch component 345 has a first end coupled to the first end of the second capacitive component 344 and a second end coupled to the comparing circuit 330, and is used for selectively making the first end of the third switch component 345 coupled to the first end of the second capacitive component 344 according to the second clock signal $\psi_2$. The comparing circuit 330 is electrically coupled to both the first voltage generator 310 and the second voltage generator 320 for comparing the first voltage $V_1$ with the second voltage $V_r$ to thereby generate the above-mentioned comparing signal $V_{adj}$. According to the comparing signal $V_{adj}$, the time constant calibration 300 then adjusts the capacitance value of the first capacitive component 341 until the first voltage $V_1$ is equal to the second voltage $V_r$, whereby a time constant defined by an equivalent capacitance corresponding to the first current $I_1$ passing through the first capacitive component 341 and an equivalent impedance corresponding to the second current $I_2$ passing through the resistive component $R_1$ reaches a predetermined value (i.e., $R_1*C_1=T/2K$). Because the first voltage $V_1$ is equal to $I_1*T/(2*N*C_a)$, where $C_a$ is a capacitance value of the first capacitive component 341, the objective adjusting the first voltage $V_1$ is achieved by adjusting the value N.

Please note that the analog variable capacitor (i.e., the first capacitive component 341) comprises a predetermined capacitor with a first capacitance value $C_a$ and adopts a capacitance multiplication technique to make the capacitance value of the analog variable capacitor correspond to a second capacitance value $C_1$ greater than the first capacitance value $C_a$, where $C_1=N*C_a$, and N is greater than 1. In this embodiment, the capacitance multiplication technique is utilized to adjust the first capacitive component 341, where the capacitance multiplication technique can multiply the capacitance value $C_a$ of a small capacitor by a factor N to thereby obtain the desired capacitance value of the first capacitive component 341. In a case where the capacitance value $C_1$ keeps invariant, the chip area of the capacitor becomes smaller as the value of N becomes greater (i.e., the needed capacitance value of the first capacitive component $C_a$ becomes smaller). For example, provided that N is designed to be 10, chip area of the capacitor is 10 times smaller than the original capacitor design. Please note that the capacitance value of the first capacitive component 341 has to be properly adjusted for compensating process variations of both the first capacitive component 341 and the resistive component $R_1$, thus a variable range of the value N must cover the process variations of both the first capacitive component 341 and the resistive component $R_1$.

Figure 4:
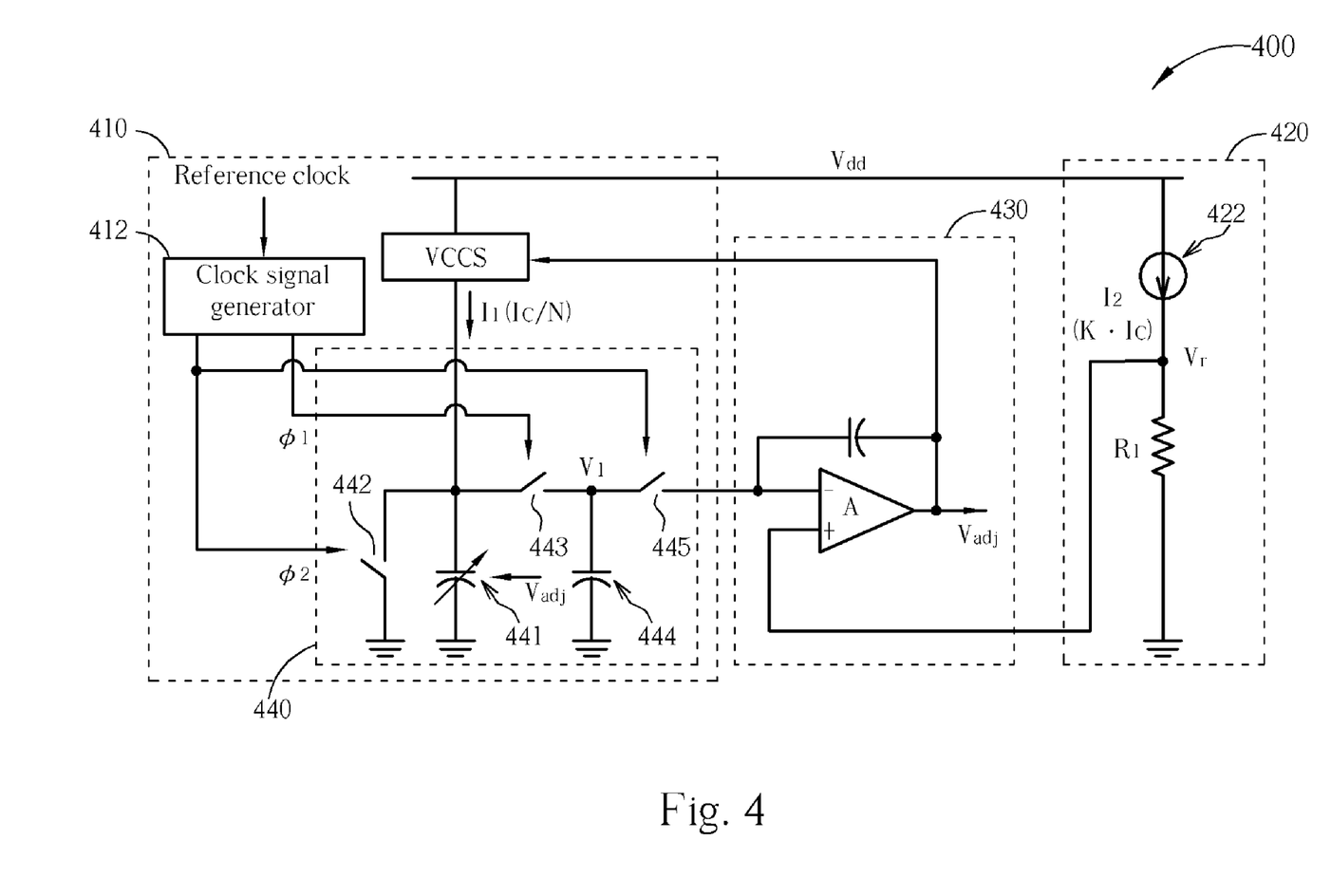
FIG. 4 is a circuit diagram illustrating a time constant calibration device according to a second embodiment of the present invention.

Please refer to FIG. 4. FIG. 4 is a circuit diagram illustrating a time constant calibration device 400 according to a second embodiment of the present invention. As shown in FIG. 4, the time constant calibration device 400 comprises a first voltage generating circuit 410, a second voltage generating circuit 420, and a comparing circuit 430. The second voltage generating circuit 420 utilizes a second current $I_2$ ($I_2=K*I_c$) passing through a resistive component $R_1$ to thereby generate a second voltage $V_r$. The first voltage generator 410 comprises a clock signal generator 412, a voltage-controlled current source (VCCS) 414 and a switching-capacitor circuit 440. The clock signal generator 412 is for generating a first clock signal $\psi_1$ and a second clock signal $\psi_2$, wherein the first clock signal $\psi_1$ and the second clock signal $\psi_2$ with a period T are nonoverlapped to each other. The voltage-controlled current source 414 has a first end coupled to a first voltage level $V_{dd}$, and serves as the above-mentioned analog adjusting component and is coupled to the comparing circuit 430 for adjusting a first current $I_1$ (where $I_1=I_c/N$) generated by the voltage-controlled current source 414 according to the comparing signal $V_{adj}$. The switching-capacitor circuit 440 comprises a first capacitive component 441 having a capacitance value equal to aforementioned $C_a$ (i.e., the first capacitive component 441 is implemented by a small capacitor), a first switch component 442, a second switch component 443, a second capacitive component 444, and a third switch component 445. The first capacitive component 441 has a first end coupled to the voltage-controlled current source 414 and a second end coupled to a second voltage level (i.e., a ground terminal), and is charged according to the first current $I_1$ provided by the voltage-controlled current source 414 to generate a first voltage $V_1$. The first switch component 442 has a first end coupled to the second voltage level and a second end coupled to the first end of the first capacitive component 441, and is for selectively making the second end of the first switch component 442 coupled to the first end of the first capacitive component 441 according to the second clock signal $\psi_2$ to discharge the first capacitive component 441. The second switch component 443 has a first end coupled to the first end of the first capacitive component 441, and is for selectively making the first end of the second switch component 443 coupled to the first end of the first capacitive component 441 according to the first clock signal $\psi_1$. The second capacitive component 444 has a first end coupled to a second end of the second switch component 443 and a second end coupled to the second voltage level. The third switch component 445 has a first end coupled to the first end of the second capacitive component 444 and a second end coupled to the comparing circuit 430, and is for selectively making the second end of the third switch component 445 coupled to the first end of the second capacitive component 444 according to the second clock signal $\psi_2$. The comparing circuit 430 is electrically coupled to both the first voltage generator 410 and the second voltage generator 420 for comparing the first voltage $V_1$ with the second voltage $V_r$ to thereby generate a comparing signal $V_{adj}$. According to the comparing signal $V_{adj}$, the time constant calibration 400 then adjusts the current magnitude of the first current $I_1$ generated by the voltage-controlled current source 414 until the first voltage $V_1$ is equal to the second voltage $V_r$, whereby a time constant defined by an equivalent capacitance corresponding to the first current $I_1$ passing through the first capacitive component 441 and an equivalent impedance corresponding to the second current $I_2$ passing through the resistive component $R_1$ reaches a predetermined value (i.e., $R_1*C_1=T/2K$). That is, owing to the first voltage $V_1$ is equal to $(I_c/N)*T/(2*C_a)$, the objective of adjusting the first voltage $V_1$ is thus achieved by adjusting the value N.

As previously mentioned, the first embodiment of the present invention fixes a current magnitude provided by a constant current source and adopts a capacitance multiplication technique to adjust a capacitance value of the variable capacitor to thereby calibrate a time constant in an analog manner through a comparing signal $V_{adj}$. However, since directly adjusting a capacitance value of the capacitor is not suitable at some specified application circuits, the second embodiment of the present invention fixes a capacitance value of a capacitor and adjusts an output current of a voltage-controlled current source by the comparing signal $V_{adj}$ to thereby achieve the same objective of calibrating the RC time constant. Please note that, provided technical characteristics of aforementioned two embodiments are combined together (i.e., a voltage-controlled current source and a variable capacitor are both adopted), the same objective of calibrating the time constant can be achieved by proper controls. This alternative design described above also falls within the scope of the present invention.

Figure 5:
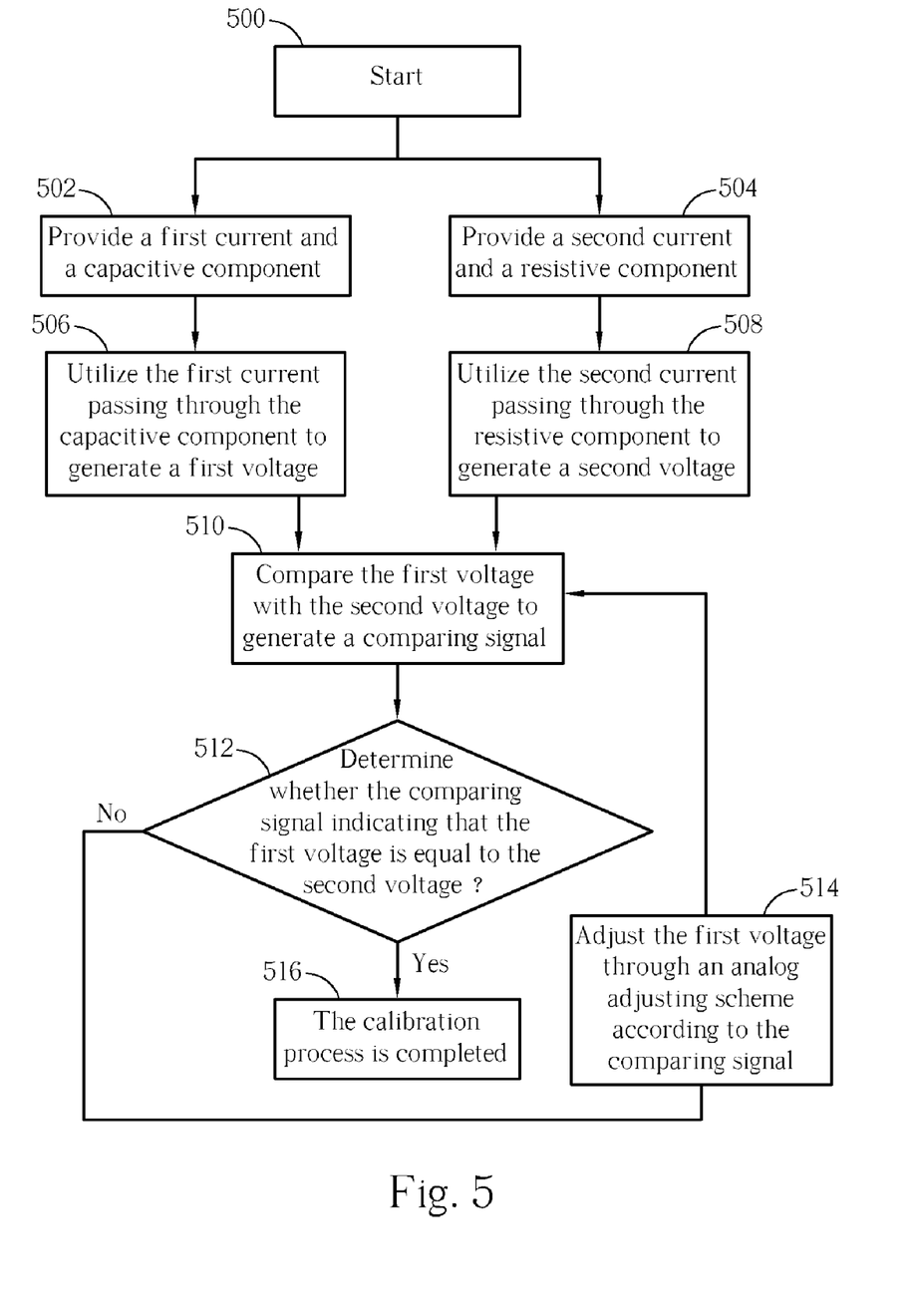
FIG. 5 is a generalized flowchart of a time constant calibration method according to one embodiment of the present invention.

Please refer to FIG. 5. FIG. 5 is a generalized flowchart of a time constant calibration method according to one embodiment of the present invention. It should be noted that if the same result is substantially achieved, the steps of the flowchart shown in FIG. 5 do not need to be in the exact order shown thereon. The detailed description of the steps is as below.

Step 500: Start.
Step 502: Provide a first current and a capacitive component.
Step 504: Provide a second current and a resistive component.
Step 506: Utilize the first current passing through the capacitive component to generate a first voltage.
Step 508: Utilize the second current passing through the resistive component to generate a second voltage.
Step 510: Compare the first voltage with the second voltage to generate a comparing signal.
Step 512: Determine whether the comparing signal indicating that the first voltage is equal to the second voltage. If so, proceed to Step 516; otherwise, proceed to Step 514.
Step 514: Adjust the first voltage through an analog adjusting scheme according to the comparing signal (i.e., adjust the capacitive component implemented by a variable capacitor or adjust a voltage-controlled current source providing the first current). Then, return to Step 510.
Step 516: The calibration process is completed (i.e., at this moment, a time constant, defined by an equivalent capacitance corresponding to the first current passing through the capacitive component and an equivalent impedance corresponding to the second current passing through the resistive component, reaches a predetermined value.).

Compared with the prior art, the present invention not only reduces circuit area and power consumption simultaneously, but also avoids using a bandgap reference voltage generator to generate a bandgap reference voltage. Therefore, the circuit's design becomes simpler and more flexible. Furthermore, the present invention utilizes an analog voltage control signal in conjunction with a variable capacitor being controlled in an analog manner and further incorporates a capacitance multiplication technique, thereby greatly reducing the chip area occupied by capacitors.

Those skilled in the art will readily observe that numerous modifications and alterations of the device and method may be made while retaining the teachings of the invention.

What is claimed is:

1. A time constant calibration device, comprising:
a first voltage generating circuit, utilizing a first current passing through a first capacitive component to generate a first voltage;
a second voltage generating circuit, utilizing a second current passing through a resistive component to generate a second voltage; and
a comparing circuit electrically coupled to both the first voltage generating circuit and the second voltage generating circuit for comparing the first voltage with the second voltage to generate a comparing signal, wherein the first voltage generating circuit comprises an analog adjusting component for adjusting the first voltage according to the comparing signal until the first voltage is equal to the second voltage, whereby a time constant defined by an equivalent capacitance corresponding to the first current passing through the capacitive component and an equivalent impedance corresponding to the second current passing through the resistive component reaches a predetermined value.

2. The time constant calibration device of claim 1, wherein the first capacitive component comprises a predetermined capacitor with a first capacitance value and adopts a capacitance multiplication technique for making a capacitance value of the first capacitive component correspond to a second capacitance value greater than the first capacitance value.

3. The time constant calibration device of claim 1, wherein the first voltage generating circuit comprises:
a clock signal generator, for generating a first clock signal and a second clock signal, wherein the first clock signal and the second clock signal are non-overlapped to each other;
a voltage-controlled current source, having one end coupled to a first voltage level, for providing the first current, wherein the voltage-controlled current source serves as the analog adjusting component and the voltage-controlled current source is coupled to the comparing circuit for adjusting the first current according to the comparing signal;
the first capacitive component, having a first end coupled to the voltage-controlled current source and a second end coupled to a second voltage level, wherein the first capacitive component is charged according to the voltage-controlled current source to generate the first voltage;
a first switch component, having a first end coupled to the second voltage level and a second end coupled to the first end of the first capacitive component, for selectively making the first end of the first switch component coupled to the first end of the first capacitive component according to the second clock signal to thereby discharge the first capacitive component;
a second switch component, having a first end coupled to the first end of the first capacitive component, for selectively making a second end of the second switch component coupled to the first end of the first capacitive component according to the first clock signal;
a second capacitive component, having a first end coupled to the second end of the second switch component and a second end coupled to the second voltage level; and
a third switch component, having a first end coupled to the first end of the second capacitive component and a second end coupled to the comparing circuit, for selectively making the second end of the third switch component coupled to the first end of the second capacitive component according to the second clock signal.

4. A time constant calibration method, comprising:
providing a first current and a capacitive component;
utilizing the first current passing through the capacitive component to generate a first voltage;
providing a second current and a resistive component;
utilizing the second current passing through the resistive component to generate a second voltage;
comparing the first voltage and the second voltage to generate a comparing signal; and
adjusting the first voltage by an analog adjusting manner according to the comparing signal until the first voltage is equal to the second voltage, whereby a time constant defined by an equivalent capacitance corresponding to the first current passing through the capacitive component and an equivalent impedance corresponding to the second current passing through the resistive component reaches a predetermined value.

5. The time constant calibration method of claim 4, wherein the capacitive component is an analog variable capacitor comprising a predetermined capacitor having a first capacitance value and adopting a capacitance multiplication technique for making a capacitance value of the analog variable capacitor correspond to a second capacitance value greater than the first capacitance value; and the analog adjusting manner adjusts the second capacitance value of the analog variable capacitor according to the comparing signal to thereby adjust the first voltage.

6. The time constant calibration method of claim 4, wherein the analog adjusting manner adjusts the first current provided by a voltage-controlled current source according to the comparing signal to thereby adjust the first voltage.

* * * * *